(12) United States Patent
Bastian et al.

(10) Patent No.: US 6,872,253 B2
(45) Date of Patent: Mar. 29, 2005

(54) METHOD OF FORMING A SEMICONDUCTOR COMPONENT

(75) Inventors: Georg Bastian, Korntal-Münchingen (DE); Roland Münzner, Bissingen (DE)

(73) Assignee: Avanex Corporation, Fremont, CA (US)

(*) Notice: Subject to any disclaimer, the term of this patent is extended or adjusted under 35 U.S.C. 154(b) by 90 days.

(21) Appl. No.: 10/320,503

(22) Filed: Dec. 17, 2002

(65) Prior Publication Data

US 2003/0129778 A1 Jul. 10, 2003

(30) Foreign Application Priority Data

Jan. 7, 2002 (EP) ............................................. 02360004

(51) Int. Cl.[7] ............................................. C30B 25/12
(52) U.S. Cl. ..................................... 117/100; 385/145
(58) Field of Search ........................ 430/316; 385/146; 117/100

(56) References Cited

U.S. PATENT DOCUMENTS 5,385,114 A    1/1995   Milstein et al.
5,705,321 A    1/1998   Brueck et al.
5,955,749 A    9/1999   Joannopoulos et al.
5,987,208 A    11/1999  Gruning et al.

FOREIGN PATENT DOCUMENTS

| DE | 100 11 253 A1 | 9/2001 |
| WO | WO 98/53351 A2 | 11/1998 |
| WO | WO 99/09439 A1 | 2/1999 |
| WO | WO 99/41626 A1 | 8/1999 |

OTHER PUBLICATIONS

Aimin Liu, "Microstructure and Photoluminescenxe Spectra of Porous InP", Letter to the Editor, Institute of Physics Publishing, Nanotechnology 12, Aug. 20, 2001, pp. L1–L3.

*Primary Examiner*—Felisa Hiteshew
(74) *Attorney, Agent, or Firm*—Moser, Patterson & Sheridan, L.L.P.

(57) ABSTRACT

The invention relates to a method of forming a semiconductor component comprising the steps of:
- providing a semiconductor substrate,
- forming a pattern of pores in the semiconductor substrate, the pores having a first depth,
- photoassisted wet etching of the substrate for etching of the pores to a second depth, the second depth being substantially greater than the first depth.

10 Claims, 4 Drawing Sheets

METHOD OF FORMING A SEMICONDUCTOR COMPONENT

The invention is based on a priority application EP 02 360 004.2 which is hereby incorporated by reference.

FIELD OF THE INVENTION

The invention relates to the field of manufacturing of semiconductor components, and more particularly to the field of optical components.

BACKGROUND AND PRIOR ART

It is known from the prior art to manufacture sub-micrometer periodic structures, such as photonic crystals, by means of e-beam-lithography. In fact e-beam-lithography is the only prior art method which can be utilized for the manufacturing of such structures, especially if aspect ratios of 1 to 200 and above need to be accomplished. However, e-beam-lithography is an expensive process which limits its field of application.

In U.S. Pat. No. 5,385,114 a method of preparing a photonic crystal is described in which the pores of a reticulated mesh are impregnated with a suitable liquid dielectric material which is then solidified. In order to introduce the dielectric material, the material of the mesh must have a much higher melting point than the dielectric material and so, for example, the material of the mesh is a metal. Thereafter, the mesh is dissolved using a suitable liquid chemical reactant to leave a porous dielectric material. The pores of the dielectric material have a different refractive index to the material itself, so a periodic structure made in this way would enable the material to function as a photonic crystal.

After the reticulated mesh has been removed, the pores in the dielectric material may be filled with a separate material that has a refractive index different to the refractive index of the dielectric material. In this document the method of pore filling is demonstrated using a random rather than a periodic metallic mesh but it is envisaged that a periodic metal mesh could be formed by freezing electrohydrodynamically generated metal droplets, by weaving a mesh of wires, by assembling small pieces or, by inference from the preamble, by drilling or reactive ion etching a slap of metal through a mask.

WO 99/09439 A1 shows a method of forming a photonic crystal material. The photonic crystal material has a 3-D periodic structure with a periodicity that varies on a length scale comparable to the wavelength of electromagnetic radiation. The 3-D periodic structure is produced by irradiating photosensitive material with electromagnetic radiation such that interference between radiation propagating in different directions within the sample gives rise to a 3-D periodic variation in intensity within the sample. Thereafter the irradiated material is developed to remove the less or more irradiated regions of the material to produce a structure having 3-D periodicity in the refractive index of the composite material. This method is limited to very special photo sensitive materials.

WO 99/41626 A1 shows an optical grating structure. The grating structure is arranged in a substrate containing a semiconductor material, so that light having a frequency within a particular frequency band cannot propagate in the grating structure. The grating structure comprises an arrangement of pores and a defective zone. The pores outside the defective zone are arranged in a periodical pattern and the periodical pattern is disturbed in the defective zone. The surface of the grating structure is provided with a conductive layer at least in the area of the detective zone. The grating structure is produced by electro chemical etching of n-doped silicon.

From "Microstructure and photoluminescence spectra of porous InP", Aimin Liu, Institute of Physics Publishing, Nanotechnology 12 (2001) L1–L3, a method for electro chemical etching InP in known for the fabrication of porous InP. Quantum confinement effects taking place in nanometer-size semiconductor particles are used, i.e. quantum confinement effect induced photoluminescence emission can be observed. The microstructure of the porous layer strongly depends on the potential voltage applied on the InP electrode. Another method for producing porous semiconductors relying on electro chemical etching is known from DE 100 11 253 A1.

It is therefore an object of the present invention to provide for an improved method of forming a semiconductor component, such as an optical component.

SUMMARY OF THE INVENTION

The underlying problem of the present invention is solved basically by applying the features laid down in the independent claims. Preferred embodiments of the invention are given in the dependent claims.

The present invention is particularly advantageous as it allows to fabricate a semiconductor component having pores with a high aspect ratio in a very efficient way. Initially pores are formed on the surface of the semiconductor substrate with a low aspect ratio. Subsequently a photoassisted wet etching step is employed in order to continue the etching of the pores to a high aspect ratio of preferably above 1 to 50 or even to 1 to 200 or 1 to 300.

In a preferred embodiment of the invention a substantially homogeneous radiation field is applied during the photoassisted etching of the initially formed pores.

Due to quantum confinement effects the photoassisted wet etching is performed in a self-adjusting way. This relies on the fact that the energy-absorption characteristic of a photon is different with respect to the un-etched semiconductor substrate surface and the etched semiconductor substrate surface. Preferable the energy of the photons is chosen such that a high percentage of the photons is absorbed on the bottom of the pores.

In accordance with a further preferred embodiment of the invention an interference pattern is employed during the photoassisted wet etching for creation of a three dimensional structure. The direction of the photoassisted wet etching is determined by nodes of the interference pattern which are formed within the pores; this way curved pores can be formed.

The present invention is particularly advantageous for the fabrication of optical components, such as photonic crystals, reflectors, wave guides and optical modules.

BRIEF DESCRIPTION OF THE DRAWINGS

In the following preferred embodiments of the invention are described in greater detail by making reference to the drawings in which:

FIG. 1 shows a flow chart of a preferred embodiment of the invention for forming a semiconductor component. In step 1 a semiconductor substrate is provided. Preferably the semiconductor substrate comprises indium phosphite or gallium arsenide or another 3–5 semiconductor. However, it is important to note that the application of the present invention is not restricted to a particular class of semiconductors.

Figure 1:
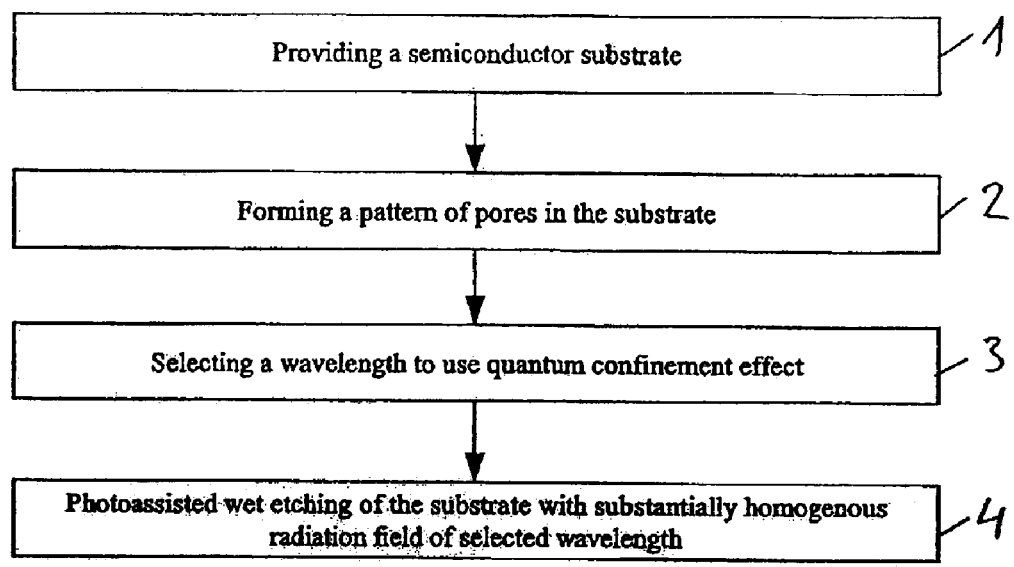
FIG. 1 is illustrative of an embodiment of the method of forming a semiconductor component.

In step 2 a pattern of pores is formed in the substrate. For example the pores are formed by means of a dry etching method such as ion etching or another dry etching process. The position of the pores formed in step 2 and the diameter of the pores determines the position and diameter of the pores to be formed in the end product.

Preferably the depth of the pores formed step 2 is in the same order of magnitude than the diameter of the pores. In other words the aspect ratio of the pores is about 1:0.5 to 1:2.

As an alternative to dry etching photoassisted wet etching can also be utilized. For this purpose an interference pattern is applied to the surface of the substrate. The nodes of the interference pattern determine the positions of the pores as the rate of the wet chemical etching strongly depends on the amount of the absorbed light.

It is important to note that the pattern of pores can be formed in the substrate in step 2 by means of other prior art techniques and that it is not essential to apply etching methods. This is due to the fact that a pattern of pores where the pores have aspect ratios in the order of 1:0.5 to 1:2 can be readily fabricated by a variety of different methods.

In step 3 a wove length is selected for the following photoassisted wet etching in step 4 for usage of the quantum confinement effect for self-adjustment of the etching process. The selection of the wove length is explained in greater detail with respect to FIG. 2.

In step 4 photoassisted wet etching of the substrate is performed while applying a substantially homogenous radiation field of the selected wave length. As a result of the quantum confinement effect the likelihood of absorption of a photon on the upper etched surface of the substrate is much lower than the likelihood of absorption of the photon on the bottom of a pore. This has the consequence that the photons are "sucked" into the pores and that the etching process is concentrated on the bottoms of the pores. This way pores can be created having aspect ratios above 1:200.

The new approach is based on the fact, that the rate of wet chemical etching can strongly depend on the illumination of the sample during this process, i.e. the number of the generated electron-hole pairs due to absorption of the light. Wet chemical etching usually works within two stages—the oxidation of the surface and the solution of the oxides. The oxidation is assisted by the electrochemical environment like ion-concentrations or number of free charges inside the material being etched, which includes the number of optically excited electron-hole pairs. The absorption properties depend on the band structure of the sample and the used wavelength.

If the sample is illuminated with an interference pattern (holographic lithography), bright and dark periodic structures are formed and as a consequence a periodic structure will be etched. When the size of this pattern becomes smaller and well pronounced, the etched parts are not three dimensional anymore, but two or one dimensional. This changes the absorption properties (usually a shift of the gad gap to higher energies due to a higher confinement) such that a properly chosen photon energy cannot be absorbed anymore).

Therefore the readily etched parts of the sample are not etched anymore, but deeper parts, where the sample is three dimensional, still will be etched until a periodic pattern in all three directions is formed.

This self-adjusting process allows the etching of a homogeneous pattern along the depth, although the etching starts at one surface, which is exposed a much longer time to the etchant. This technique can also be used for dry chemical etching.

The present invention enables to create pores in a substrate having high aspect ratios in a very cost efficient and accurate way due to the usage of the self-adjusting effect based on the quantum confinement effect. This compares to prior art solutions which require either a time-consuming process to produce a layered structure or which are limited to photo sensitive materials with holographic lithography, whereby the latter cannot cir-cumvent problems of inhomogenity along the depth. In addition short light pulses are needed in the prior art such that the change of the fractional index does not smear the interference pattern.

Figure 2:
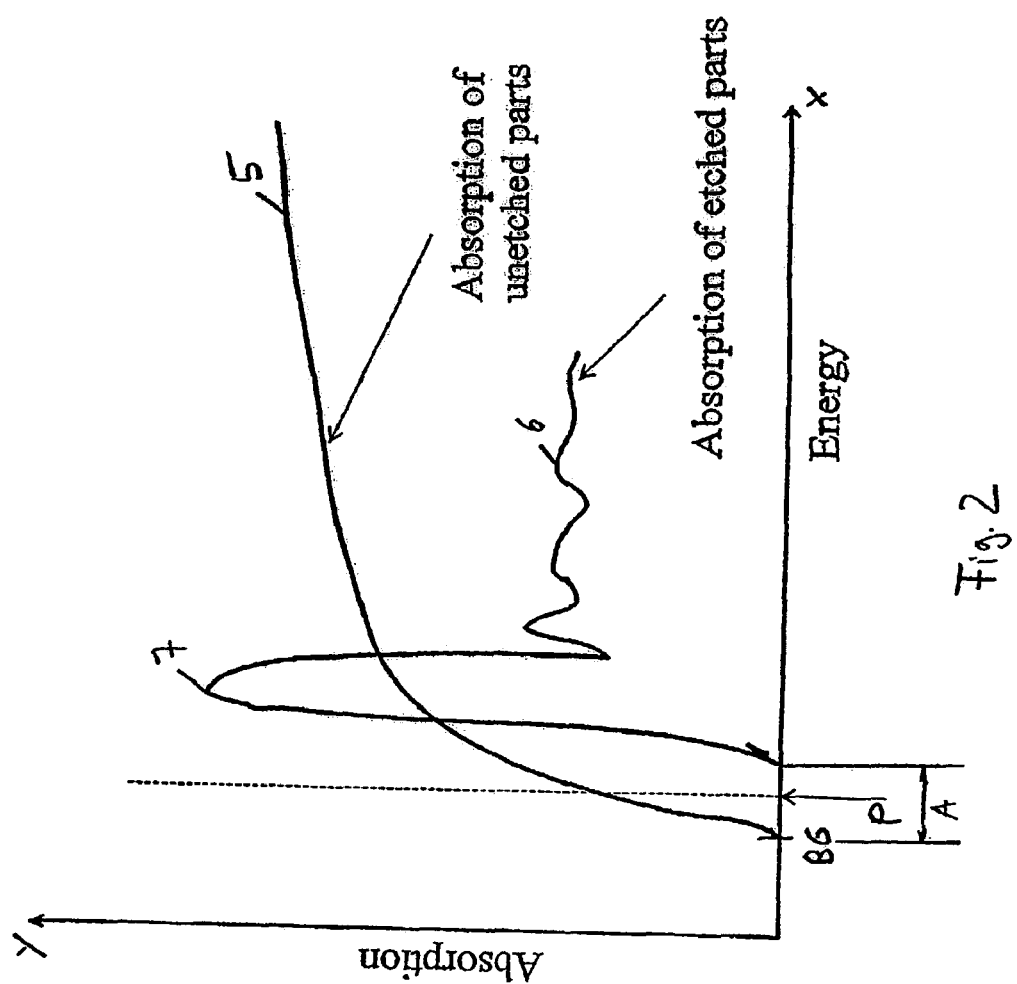
FIG. 2 is illustrative of the energy absorption characteristics of etched and un-etched parts of the substrate.

FIG. 2 is illustrative of the energy-absorption characteristics of etched and un-etched parts of the semiconductor substrate. The curve 5 shows the energy-absorption characteristic of un-etched parts of the semiconductor substrate. The x-axis shows the energy of a photon impinging upon the substrate surface and the y-axis shows the likelihood of absorption of the photon within the substrate. The curve 5 starts at the energy level of the band gap BG of the semiconductor material.

The curve 6 shows the energy-absorption characteristic of etched parts of the semiconductor substrate. The curve 6 is shifted with respect to the curve 5 by a distance A. The curve 6 has a peak 7 and then falls back below the curve 5 at higher energy levels.

The photon energy p, i.e. the wave length to be used for the photoassisted wet etching, is selected out of the interval between the band gap BG and the band gap BG plus the distance A. For such a choice of the photon energy p there is a likelihood of absorption in the un-etched parts of the substrate which is greater than zero and a likelihood of absorption in the etched parts of the substrate which is substantially equal to zero.

This selective absorption of photons by the substrate is the base for fabricating pores having a high aspect ratio in a self-adjusting process.

Figure 3:
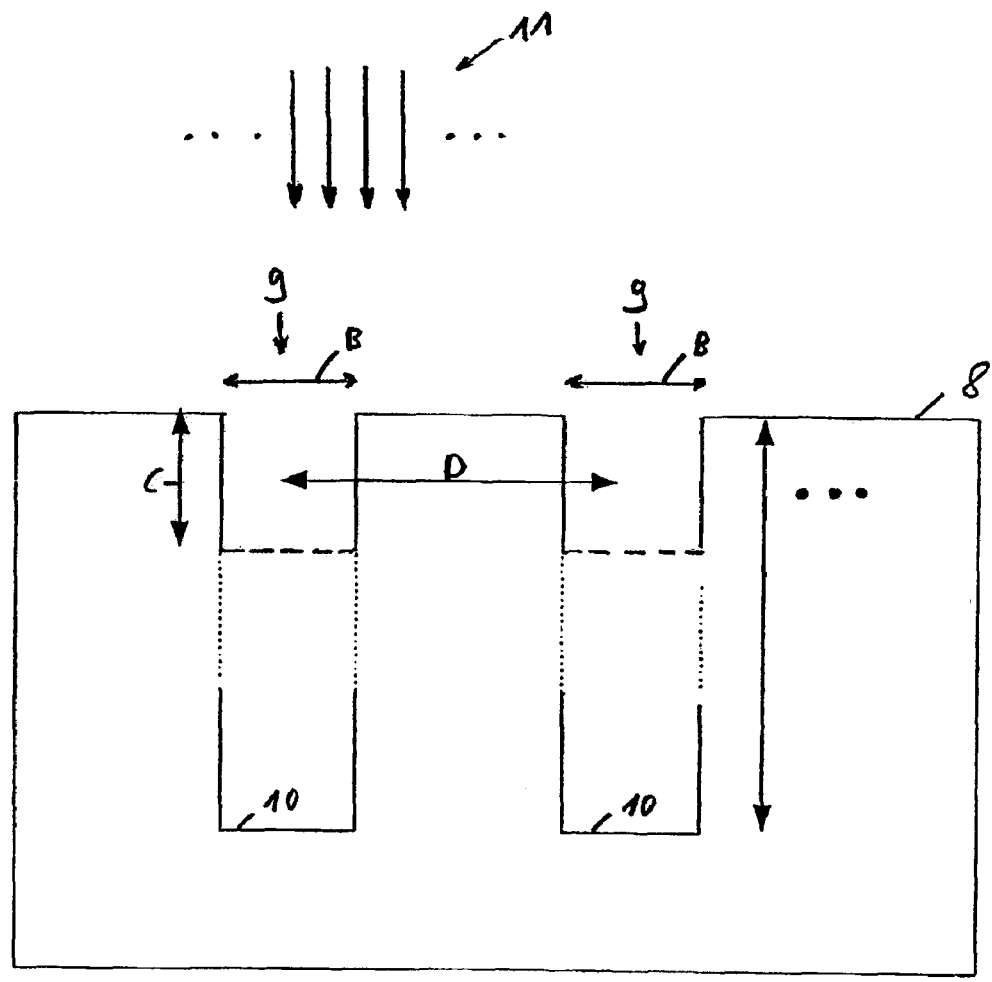
FIG. 3 is a schematic diagram of a semiconductor component during successive steps of the manufacturing process.

FIG. 3 shows a semiconductor substrate 8. A regular pattern of pores 9 is formed within the semiconductor substrate 8 in a first manufacturing step. This corresponds to the step 2 of FIG. 1.

For example the diameter B of the pores 9 is about 500 nm. The depth C of the pores is also about 500 nm. In other words, the aspect ratio of the pores 9 is about 1:1 after the first manufacturing step. The pores 9 are spaced apart by a distance D which is about 1.5 $\mu$m.

The wave length to be used for the photoassisted wet etching is selected in accordance with the principles explained with reference to FIG. 2. A photon approaching the surface of the semiconductor substrate 8 has a likelihood of being absorbed on the etched surface of the semiconductor 8 which is given by the curve 6. If the photon energy is properly chosen in the interval between BG and BG+A this likelihood is substantially zero such that there is little or no etching at the upper surface of the semiconductor substrate 8.

As opposed to this the likelihood of absorption of the photon on the bottom 10 of a pore 9 is given by the curve 5. For a proper choice of the photon energy p this results in a likelihood of absorption which is substantially greater than zero. This means that a large percentage of the photons of the homogeneous radiation field 11 applied to the semiconductor substrate 8 are absorbed at the bottoms 10 of the pores 9 rather than on the upper surface of the semiconductor substrate 8.

Figure 4:
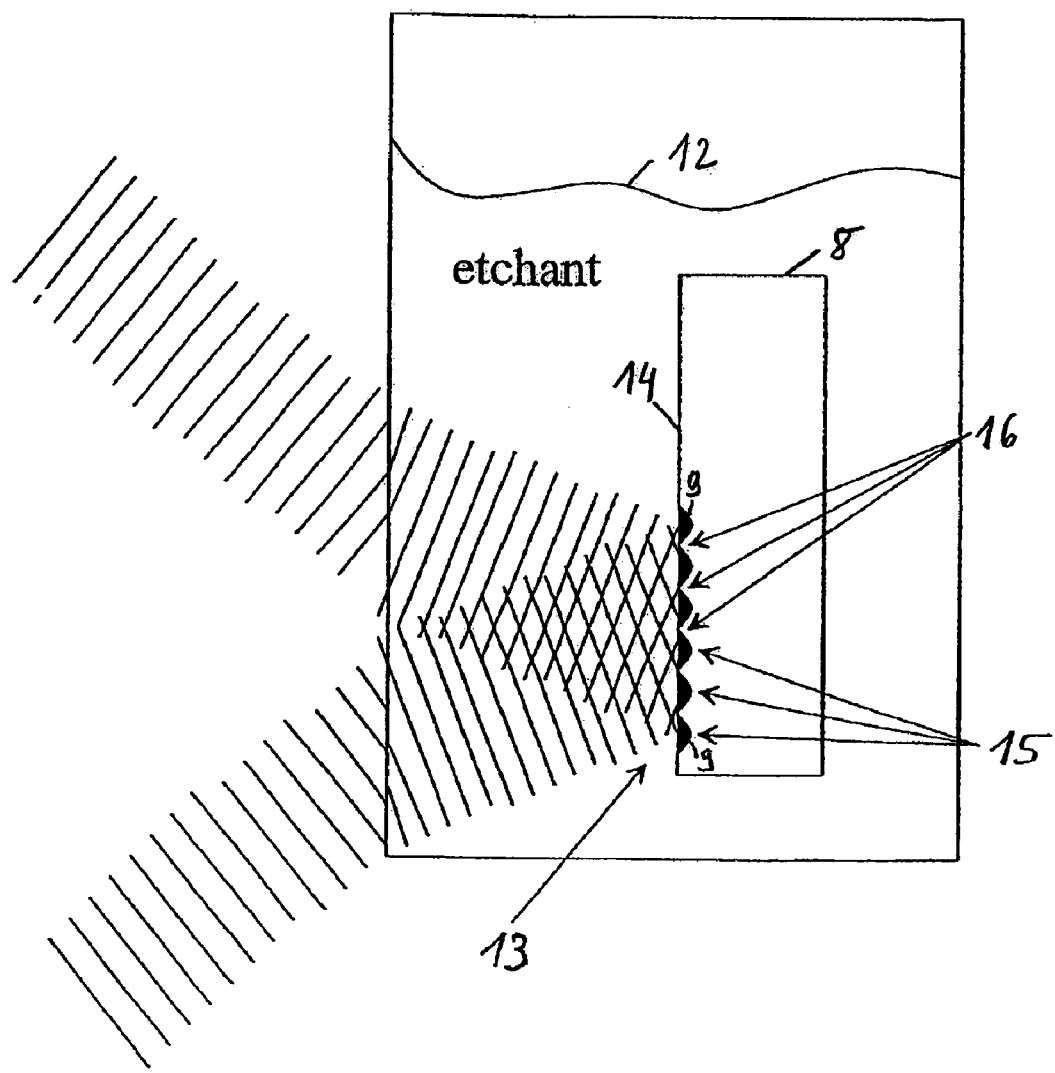
FIG. 4 is a schematic diagram illustrating a manufacturing set up.

FIG. 4 shows a manufacturing set up. The semiconductor substrate 8 is put into an etchant 12 for photoassisted wet etching of the semiconductor substrate 8. In the first manufacturing step (cf. step 2 of FIG. 1) a pattern of pores 9 is formed in the semiconductor substrate 8 (cf. FIG. 3). The pores 9 have an aspect ratio of about 1 to 1. These pores 9 are fabricated by exposing the semiconductor substrate 8 to a holographic interference pattern 13.

The position of nodes of the interference pattern 13 on the upper surface 14 of the semiconductor substrate 8 determines the position of the pores 9. The positions of such nodes of the interference pattern 13 is indicated by arrows 15. Likewise positions of destructive interference with little or no radiation are indicated by arrows 16.

After the initial manufacturing of the "seed" pores 9 the interference pattern 13 is switched off and the surface 14 of the semiconductor substrate 8 is subjected to a homogeneous radiation field with photons of the selected wave length (cf. steps 3 and 4 of FIG. 1).

Alternatively an interference pattern is also used for the deep etching of the pores 9 instead of an homogeneous radiation field if a three dimensional structure is to be created. By means of such an interference pattern extending within the pores 9 curved pores can be created.

What is claimed is:

1. A method of forming a semiconductor component comprising:

providing a semiconductor substrate;

forming a pattern of pores in the semiconductor substrate, the pores having a first depth; and photoassisted wet etching of the substrate for etching of the pores to a second depth, the second depth being substantially greater than the first depth, wherein photons used for the photoassisted wet etching have an energy level that causes substantially zero photons to be absorbed on a surface of the semiconductor substrate and causes substantially more than zero photons to be absorbed at bottoms of the pores.

2. The method of claim 1, wherein the pores with the first depth have an aspect ratio in the order of 1:0.5 to 1:2.

3. The method of claim 1, wherein the pores with the second depth have an aspect ratio above 1:50.

4. The method of claim 1, wherein forming the pattern of pores is performed by dry or wet etching of the pores.

5. The method of claim 1, wherein the step of forming the pattern of pores includes defining positions of the pores with an interference pattern and photoassisted wet etching of the pores.

6. The method of claim 1, wherein the step of photoassisted wet etching of the substrate for etching is performed while applying a substantially homogeneous radiation field to the semiconductor substrate.

7. A method of forming a semiconductor component comprising:

providing a semiconductor substrate;

forming a pattern of pores in the semiconductor substrate, the pores having a first depth; and photoassisted wet etching of the substrate for etching of the pores to a second depth, the second depth being substantially greater than the first depth, using photons having an energy above the band gap energy and below about 1.5 times the band gap energy of the semiconductor.

8. A method of forming a semiconductor component comprising:

providing a semiconductor substrate;

forming a pattern of pores in the semiconductor substrate, the pores having a first depth; and photoassisted wet etching of the substrate for etching of the pores to a second depth, the second depth being substantially greater than the first depth, while applying an interference pattern to the semiconductor substrate in order to create a three dimensional structure within the semiconductor substrate.

9. A method of forming a semiconductor component comprising:

providing a semiconductor substrate comprising indium phosphid or gallium arsenite;

forming a pattern of pores in the semiconductor substrate, the pores having a first depth; and photoassisted wet etching of the substrate for etching of the pores to a second depth, the second depth being substantially greater than the first depth.

10. The method of claim 1, wherein the component is an optical component, such as a photonic band gap device, an optical module, a photonic crystal, a reflector or a wave guide.

* * * * *